United States Patent
Kato

(10) Patent No.: US 11,843,224 B2
(45) Date of Patent: Dec. 12, 2023

(54) QUANTUM CASCADE LASER

(71) Applicant: SUMITOMO ELECTRIC INDUSTRIES, LTD., Osaka (JP)

(72) Inventor: Takashi Kato, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 175 days.

(21) Appl. No.: 17/392,305

(22) Filed: Aug. 3, 2021

(65) Prior Publication Data

US 2022/0059995 A1 Feb. 24, 2022

(30) Foreign Application Priority Data

Aug. 21, 2020 (JP) ................. 2020-140142

(51) Int. Cl.
*H01S 5/34* (2006.01)
*H01S 5/343* (2006.01)

(52) U.S. Cl.
CPC .......... *H01S 5/3406* (2013.01); *H01S 5/3402* (2013.01); *H01S 5/34313* (2013.01); *H01S 5/34346* (2013.01)

(58) Field of Classification Search
CPC .... H01S 5/3402; H01S 5/3401; H01S 5/3406; H01S 5/3403
See application file for complete search history.

(56) References Cited

U.S. PATENT DOCUMENTS

| | | | |
|---|---|---|---|
| 6,023,482 A * | 2/2000 | Capasso | B82Y 20/00 372/45.01 |
| 6,639,254 B2 * | 10/2003 | Mukai | H01L 21/02461 257/190 |
| 6,815,736 B2 * | 11/2004 | Mascarenhas | H01L 31/1852 257/E29.093 |
| 8,488,641 B2 * | 7/2013 | Haase | H01S 5/423 372/39 |
| 8,774,571 B2 * | 7/2014 | Shinoda | G02F 1/13471 257/17 |
| 11,398,713 B2 * | 7/2022 | Okuda | G02F 1/015 |
| 2012/0230359 A1 * | 9/2012 | Kato | H01S 5/3402 372/45.01 |

FOREIGN PATENT DOCUMENTS

JP 2012-186362 A 9/2012

* cited by examiner

*Primary Examiner* — Minsun O Harvey
*Assistant Examiner* — Stephen Sutton Kotter
(74) *Attorney, Agent, or Firm* — Volpe Koenig

(57) ABSTRACT

A quantum cascade laser includes a substrate having a group III-V compound semiconductor and a core region that is provided on the substrate and that includes a group III-V compound semiconductor. The core region includes a plurality of unit structures that are stacked on top of one another. Each of the plurality of unit structures includes an active layer and an injection layer. The injection layer includes at least one strain-compensated layer including a first well layer and a first barrier layer and at least one lattice-matched layer including a second well layer and a second barrier layer. The first well layer has a lattice constant larger than a lattice constant of the substrate. The first barrier layer has a lattice constant smaller than the lattice constant of the substrate. The second well layer and the second barrier layer each have a lattice constant that is lattice-matched to the substrate.

4 Claims, 4 Drawing Sheets

QUANTUM CASCADE LASER

This application claims priority from Japanese Patent Application No. 2020-140142, filed on Aug. 21, 2020, the entire subject matter of which is incorporated herein by reference.

BACKGROUND OF THE INVENTION

1. Field of the Invention

The present disclosure relates to a quantum cascade laser.

2. Description of the Related Art

Japanese Unexamined Patent Application Publication No. 2012-186362 discloses a quantum cascade laser that includes a core layer provided on an indium-phosphide (InP) substrate. The core layer includes an active layer and an injection layer. The injection layer has a quantum well structure formed of a mixed crystal of gallium indium arsenide (GaInAs)/aluminum indium arsenide (AlInAs).

In the case of using a strain-compensated injection layer, the lattice constant of a well layer of the injection layer is larger than the lattice constant of an InP substrate, and the lattice constant of a barrier layer of the injection layer is smaller than the lattice constant of the InP substrate. As a result, the strain of the well layer with respect to the InP substrate becomes a compressive strain, and the strain of the barrier layer with respect to the InP substrate becomes a tensile strain. By increasing the absolute value of the strain of the well layer and the absolute value of the strain of the barrier layer, the energy difference $\Delta Ec$ between a conduction band of the well layer and a conduction band of the barrier layer can be increased.

However, when the absolute value of the strain of the well layer and the absolute value of the strain of the barrier layer are increased, a large strain is locally generated at the interface between the well layer and the barrier layer. In the case where well layers and barrier layers are alternately stacked on top of one another, strain accumulates, and thus, there is a possibility of a lattice defect or dislocation occurring in a crystal.

SUMMARY OF THE INVENTION

Accordingly, it is an object of the present disclosure to provide a quantum cascade laser that has a core region having a large energy difference $\Delta Ec$ and a favorable crystal quality.

A quantum cascade laser according to an aspect of the present disclosure includes a substrate that includes a group III-V compound semiconductor and a core region that is provided on the substrate and that includes a group III-V compound semiconductor. The core region includes a plurality of unit structures that are stacked on top of one another. Each of the plurality of unit structures includes an active layer and an injection layer. The injection layer includes at least one strain-compensated layer including a first well layer and a first barrier layer and at least one lattice-matched layer including a second well layer and a second barrier layer. The first well layer has a lattice constant larger than a lattice constant of the substrate. The first barrier layer has a lattice constant smaller than the lattice constant of the substrate. The second well layer and the second barrier layer each have a lattice constant that is lattice-matched to the substrate.

DESCRIPTION OF THE PREFERRED EMBODIMENTS

Description of Embodiments of Present Disclosure

Figure 1:
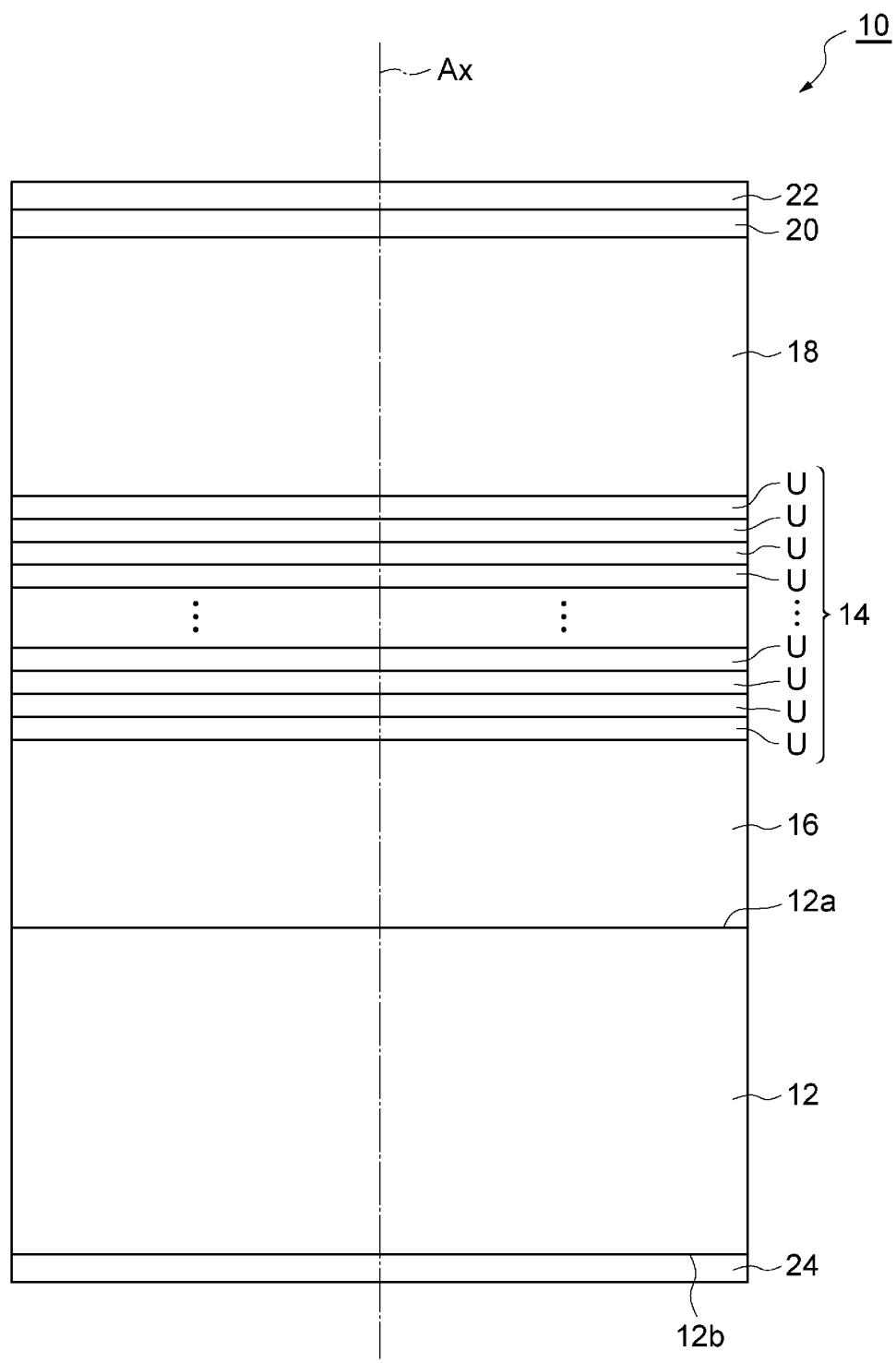
FIG. 1 is a diagram schematically illustrating a quantum cascade laser according to a first embodiment.

A quantum cascade laser according to an embodiment includes a substrate that includes a group III-V compound semiconductor and a core region that is provided on the substrate and that includes a group III-V compound semiconductor. The core region includes a plurality of unit structures that are stacked on top of one another. Each of the plurality of unit structures includes an active layer and an injection layer. The injection layer includes at least one strain-compensated layer including a first well layer and a first barrier layer and at least one lattice-matched layer including a second well layer and a second barrier layer. The first well layer has a lattice constant larger than a lattice constant of the substrate. The first barrier layer has a lattice constant smaller than the lattice constant of the substrate. The second well layer and the second barrier layer each have a lattice constant that is lattice-matched to the substrate.

According to the above-described quantum cascade laser, an energy difference $\Delta Ec$ between a conduction band of the first well layer and a conduction band of the first barrier layer can be increased by the at least one strain-compensated layer. In contrast, since the second well layer and the second barrier layer each have a lattice constant that is lattice-matched to the substrate, the absolute value of a strain of the at least one lattice-matched layer with respect to the substrate is small. Accumulation of local strain between the first well layer and the first barrier layer can be suppressed by the at least one lattice-matched layer compared with the case where the at least one lattice-matched layer is not provided. Thus, the core region having a large energy difference $\Delta Ec$ and a favorable crystal quality can be obtained.

The lattice constant of the second well layer and the lattice constant of the second barrier layer are each substantially the same as the lattice constant of the substrate. The lattice constant of the second well layer and the lattice constant of the second barrier layer may each be the same as the lattice constant of the substrate or may slightly deviate from the lattice constant of the substrate. The absolute value of the strain generated in the second well layer with respect to the substrate and the absolute value of the strain generated in the second barrier layer with respect to the substrate are both small.

The absolute value of the strain of the second well layer with respect to the substrate may be 0.3% or less. In this case, the absolute value of the strain of the second well layer with respect to the substrate is small.

The absolute value of the strain of the second barrier layer with respect to the substrate may be 0.3% or less. In this case, the absolute value of the strain of the second barrier layer with respect to the substrate is small.

An absolute value of a strain of the first well layer with respect to the substrate may be 0.5% or more. In this case, the absolute value of the strain of the first well layer with respect to the substrate is large.

An absolute value of a strain of the first barrier layer with respect to the substrate may be 0.5% or more. In this case, the absolute value of the strain of the first barrier layer with respect to the substrate is large.

The at least one lattice-matched layer may include a plurality of lattice-matched layers arranged adjacent to each other. In this case, accumulation of local strain between the first well layer and the first barrier layer can be reduced compared with the case where the strain-compensated layer is interposed between the plurality of lattice-matched layers.

The at least one strain-compensated layer may include a plurality of strain-compensated layers, and the at least one lattice-matched layer may be disposed between the plurality of strain-compensated layers. In this case, the strain-compensated layers can be arranged near the active layer. The energy in the conduction band of the first barrier layer of each of the strain-compensated layers is larger than the energy in the conduction band of the second barrier layer of each of the lattice-matched layers. Thus, the probability of leakage of carriers in the injection layer can be reduced by the first barrier layers of the strain-compensated layers.

Details of Embodiments of Present Disclosure

Embodiments of the present disclosure will be described in detail below with reference to the accompanying drawings. In the description of the drawings, the same or similar components will be denoted by the same reference signs, and repeated descriptions will be omitted.

First Embodiment

FIG. 1 is a diagram schematically illustrating a quantum cascade laser according to the first embodiment. A quantum cascade laser 10 illustrated in FIG. 1 can oscillate a laser beam in the mid-infrared region or the far-infrared region of, for example, 3 μm or more and 30 μm or less. The quantum cascade laser 10 may be used in, for example, a spectroscopic system for gas analysis or the like, an infrared imaging system, or a spatial optical communication system.

The quantum cascade laser 10 includes a first conductivity-type (e.g., n-type) substrate 12 and has a core region 14 that is provided above the substrate 12. The core region 14 has a quantum-cascade structure. The core region 14 includes a plurality of unit structures U that are stacked on top of one another along an axis Ax crossing a main surface 12a of the substrate 12. The number of unit structures U is, for example, 30 or larger and 50 or smaller. A first-conductivity-type first clad layer 16 is disposed between the substrate 12 and the core region 14. A first-conductivity-type second clad layer 18 and a first-conductivity-type contact layer 20 are arranged in this order on the core region 14. A first electrode 22 is disposed on the contact layer 20. A second electrode 24 is disposed on a rear surface 12b of the substrate 12.

The substrate 12 includes, for example, a group III-V compound semiconductor such as indium phosphide (InP). The core region 14 includes, for example, a group III-V compound semiconductor such as gallium indium arsenide (GaInAs), aluminum indium arsenide (AlInAs), or aluminum arsenide antimonide (AlAsSb). The first clad layer 16 is, for example, an InP layer. The second clad layer 18 is, for example, an InP layer. For example, the thickness of the first clad layer 16 and the thickness of the second clad layer 18 are each 1 μm or more and 2 μm or less. For example, the carrier concentration of the first clad layer 16 and the carrier concentration of the second clad layer 18 are each $2 \times 10^{17}$ $cm^{-3}$ or more and $7 \times 10^{17}$ $cm^{-3}$ or less. The contact layer 20 is, for example, a GaInAs layer. The laser cavity length of the quantum cascade laser 10 is, for example, 0.1 mm or more and 5 mm or less. A reflection film may be provided on an end face of the quantum cascade laser 10. The reflection film may be a dielectric multilayer film containing, for example, amorphous silicon (α-Si), silicon dioxide ($SiO_2$), or the like, or a metal film containing, for example, gold or the like.

Figure 2:
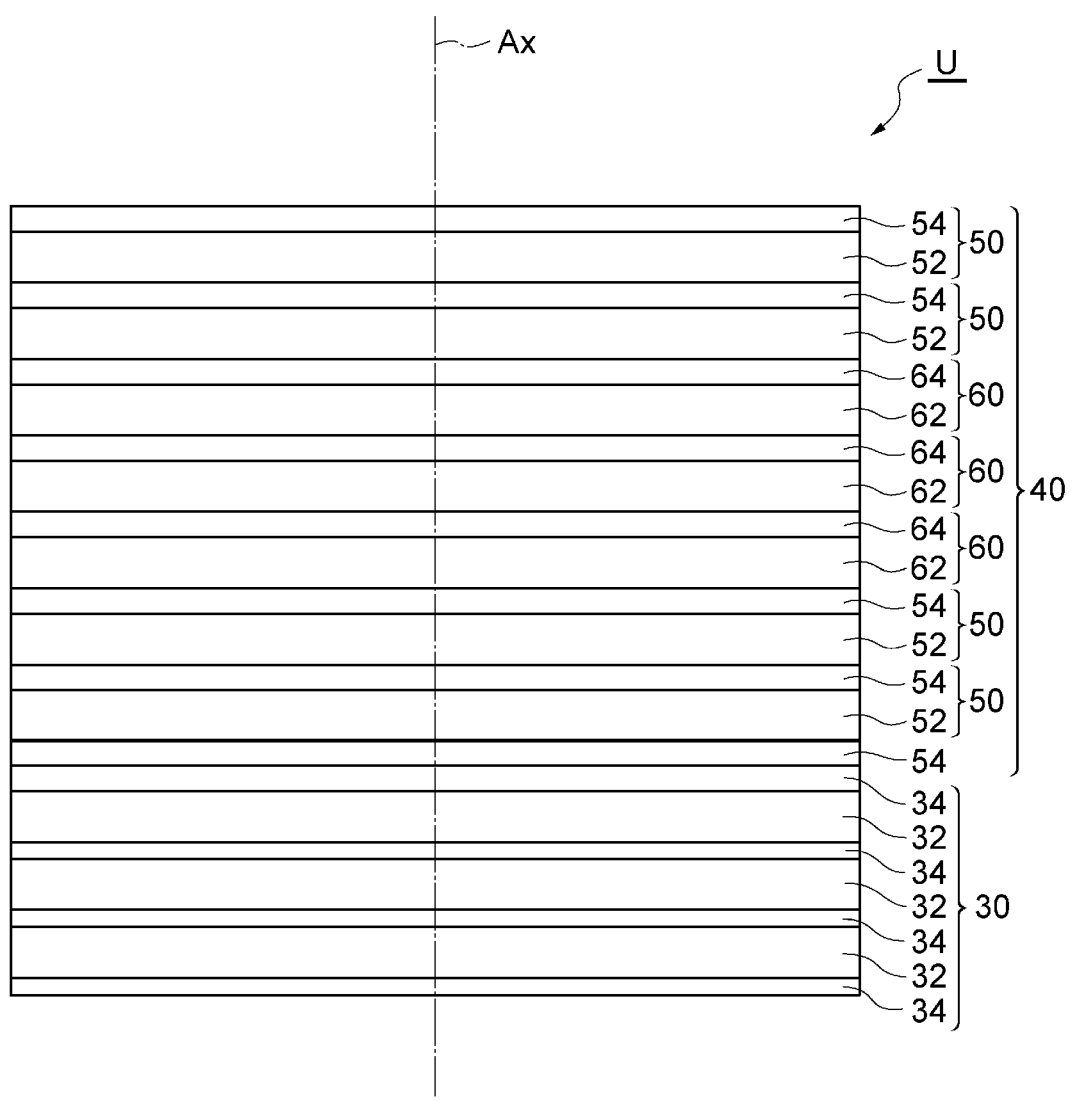
FIG. 2 is a diagram schematically illustrating one of unit structures included in a core region of the quantum cascade laser according to the first embodiment.

FIG. 2 is a diagram schematically illustrating one of the unit structures included in the core region of the quantum cascade laser according to the first embodiment. As illustrated in FIG. 2, each of the unit structures U includes an active layer 30 and an injection layer 40. The plurality of unit structures U are stacked on top of one another in such a manner that the active layers 30 and the injection layers 40 are alternately arranged along the axis Ax.

Each of the active layers 30 is a light emitting layer. Each of the active layers 30 has a quantum well structure. Each of the active layers 30 includes a plurality of well layers 32 and a plurality of barrier layers 34. In each of the active layers 30, the well layers 32 and the barrier layers 34 are alternately arranged along the axis Ax. In the direction of the axis Ax, the barrier layers 34 are positioned at the two ends of the active layer 30. Each of the well layers 32 includes, for example, a group III-V compound semiconductor such as GaInAs. Each of the barrier layers 34 includes, for example, a group III-V compound semiconductor such as AlInAs or AlAsSb. In the case where each of the barrier layers 34 includes AlAsSb, the quantum cascade laser 10 that oscillates a laser beam in a short wavelength region of, for example, 3 μm or more and 4 μm or less is obtained.

The material of the well layers 32 has a lattice constant larger than the lattice constant of the substrate 12. When the substrate 12 is, for example, an InP substrate, the lattice constant of the substrate 12 is 5.869 angstroms. The absolute value of a strain $\varepsilon_{w0}$ of each of the well layers 32 with respect to the substrate 12 may be 0.5% or more and may be 1.7% or less. When each of the well layers 32 contains, for example, $Ga_xIn_{1-x}As$ (0.22≤x≤0.39), a strain $\varepsilon_{w0}$ (compressive strain) of the well layer 32 with respect to the substrate 12 in a plane perpendicular to the axis Ax is −1.7% or more and −0.5% or less.

The material of the barrier layers 34 has a lattice constant smaller than the lattice constant of the substrate 12. The absolute value of a strain $\varepsilon_{b0}$ of each of the barrier layers 34 with respect to the substrate 12 may be 0.5% or more and may be 2.0% or less. When each of the barrier layers 34 contains, for example, $Al_xIn_{1-x}As$ (0.55≤x≤0.77), a strain $\varepsilon_{b0}$ (tensile strain) of the barrier layer 34 with respect to the substrate 12 in a plane perpendicular to the axis Ax is 0.5% or more and 2.0% or less.

The active layer 30 is strain compensated. When the total thickness of all the well layers 32 is $t_w$ and the total thickness of all the barrier layers 34 is $t_b$, an average strain $\varepsilon_a$ of the active layer 30 with respect to the substrate 12 is calculated by the following formula (1).

$$\varepsilon_a = (\varepsilon_{w0} t_w + \varepsilon_{b0} t_b) / (t_w + t_b) \tag{1}$$

The injection layer 40 injects carriers into the next active layer 30. The injection layer 40 has a quantum well structure. The injection layer 40 includes at least one strain-compensated layer 50 and at least one lattice-matched layer 60. In the present embodiment, the injection layer 40 includes a plurality of strain-compensated layers 50 and a plurality of lattice-matched layers 60. The plurality of strain-compensated layers 50 and the plurality of lattice-matched layers 60 are arranged along the axis Ax. The number of strain-compensated layers 50 may be larger than the number of lattice-matched layers 60. The thickness of each of the strain-compensated layers 50 may be larger than the thickness of each of the lattice-matched layers 60. In the present embodiment, the plurality of (e.g., three) lattice-matched layers 60 are arranged adjacent to one another. The plurality of lattice-matched layers 60 are arranged between the plurality of strain-compensated layers 50. Some (e.g., two) of the plurality of strain-compensated layers 50 are arranged between the lattice-matched layers 60 and the active layer 30. Some (e.g., two) of the plurality of strain-compensated layers 50 are arranged between the lattice-matched layers 60 and the active layer 30 of the adjacent unit structure U. The thickness of the injection layer 40 may be 20 nm or more and 70 nm or less.

Each of the strain-compensated layers 50 includes a first well layer 52 and a first barrier layer 54. The first well layers 52 and the first barrier layers 54 are alternately arranged along the axis Ax. Each of the lattice-matched layers 60 includes a second well layer 62 and a second barrier layer 64. The second well layers 62 and the second barrier layers 64 are alternately arranged along the axis Ax. In the direction of the axis Ax, the first barrier layers 54 are positioned at the two ends of the injection layer 40.

The material of the first well layer 52 has a lattice constant larger than the lattice constant of the substrate 12. The absolute value of a strain $\varepsilon_{w1}$ of each of the first well layers 52 with respect to the substrate 12 may be 0.5% or more and may be 1.7% or less. When the lattice constant of the substrate 12 is $a_0$, and the lattice constant of the material of the first well layers 52 is $a_{1w}$, the strain $\varepsilon_{w1}$ of each of the first well layers 52 with respect to the substrate 12 is calculated by the following formula (2).

$$\varepsilon_{w1}=(a_0-a_{1w})/a_{1w}\times100(\%) \quad (2)$$

When each of the first well layers 52 contains, for example, $Ga_xIn_{1-x}As$ (0.22≤x≤0.39), the strain $\varepsilon_{w1}$ (compression strain) of the first well layer 52 with respect to the substrate 12 is -1.7% or more and -0.5% or less. In the present embodiment, each of the first well layers 52 contains $Ga_xIn_{1-x}As$ (x=0.330). The thickness of each of the first well layers 52 may be 0.6 nm or more and 5 nm or less.

The material of the first barrier layers 54 has a lattice constant smaller than the lattice constant of the substrate 12. The absolute value of a strain $\varepsilon_{b1}$ of each of the first barrier layers 54 with respect to the substrate 12 may be 0.5% or more and may be 2.0% or less. When the lattice constant of the substrate 12 is $a_0$, and the lattice constant of the material of the first barrier layers 54 is $a_{1b}$, the strain $\varepsilon_{b1}$ of each of the first barrier layers 54 with respect to the substrate 12 is calculated by the following formula (3).

$$\varepsilon_{b1}=(a_0-a_{1b})/a_{1b}\times100(\%) \quad (3)$$

When each of the first barrier layers 54 contains, for example, $Al_xIn_{1-x}As$ (0.55≤x≤0.77), the strain $\varepsilon_{b1}$ (tensile strain) of the first barrier layer 54 with respect to the substrate 12 is 0.5% or more and 2.0% or less. In the present embodiment, each of the first barrier layers 54 contains $Al_xIn_{1-x}As$ (x=0.700). The thickness of each of the first barrier layers 54 may be 0.6 nm or more and 5 nm or less.

The material of the second well layers 62 has a lattice constant that is lattice-matched to the substrate 12. The lattice constant of each of the second well layers 62 is substantially the same as the lattice constant of the substrate 12. The difference between the lattice constant of each of the second well layers 62 and the lattice constant of the substrate 12 is, for example, 0.02 angstrom or smaller. The absolute value of a strain $\varepsilon_{w2}$ of each of the second well layers 62 with respect to the substrate 12 is small. The absolute value of the strain $\varepsilon_{w2}$ of each of the second well layers 62 with respect to the substrate 12 may be 0.3% or less. When the lattice constant of the substrate 12 is $a_0$, and the lattice constant of the material of the second well layers 62 is $a_{2w}$, the strain $\varepsilon_{w2}$ of each of the second well layers 62 with respect to the substrate 12 is calculated by the following formula (4).

$$\varepsilon_{w2}=(a_0-a_{2w})/a_{2w}\times100(\%) \quad (4)$$

When each of the second well layers 62 contains, for example, $Ga_xIn_{1-x}As$ (0.43≤x≤0.51), the absolute value of the strain $\varepsilon_{w2}$ of the second well layer 62 with respect to the substrate 12 is 0.3% or less. In the present embodiment, each of the second well layers 62 contains $Ga_xIn_{1-x}As$ (x=0.468). The thickness of each of the second well layers 62 may be 0.6 nm or more and 5 nm or less.

The material of the second barrier layers 64 has a lattice constant that is lattice-matched to the substrate 12. The lattice constant of each of the second barrier layers 64 is substantially the same as the lattice constant of the substrate 12. The difference between the lattice constant of each of the second barrier layers 64 and the lattice constant of the substrate 12 is, for example, 0.02 angstrom or smaller. The absolute value of a strain $\varepsilon_{b2}$ of each of the second barrier layers 64 with respect to the substrate 12 is small. The absolute value of the strain $\varepsilon_{b2}$ of each of the second barrier layers 64 with respect to the substrate 12 may be 0.3% or less. When the lattice constant of the substrate 12 is $a_0$, and the lattice constant of each of the second barrier layers 64 is $a_{2b}$, the strain $\varepsilon_{b2}$ of each of the second barrier layers 64 with respect to the substrate 12 is calculated by the following formula (5).

$$\varepsilon_{b2}=(a_0-a_{2b})/a_{2b}\times100(\%) \quad (5)$$

When each of the second barrier layers 64 contains, for example, $Al_xIn_{1-x}As$ (0.44≤x≤0.52), the absolute value of the strain $\varepsilon_{b2}$ of the second barrier layer 64 with respect to the substrate 12 is 0.3% or less. In the present embodiment, each of the second barrier layers 64 contains $Al_xIn_{1-x}As$ (x=0.476). The thickness of each of the second barrier layers 64 may be 0.6 nm or more and 5 nm or less.

Figure 3:
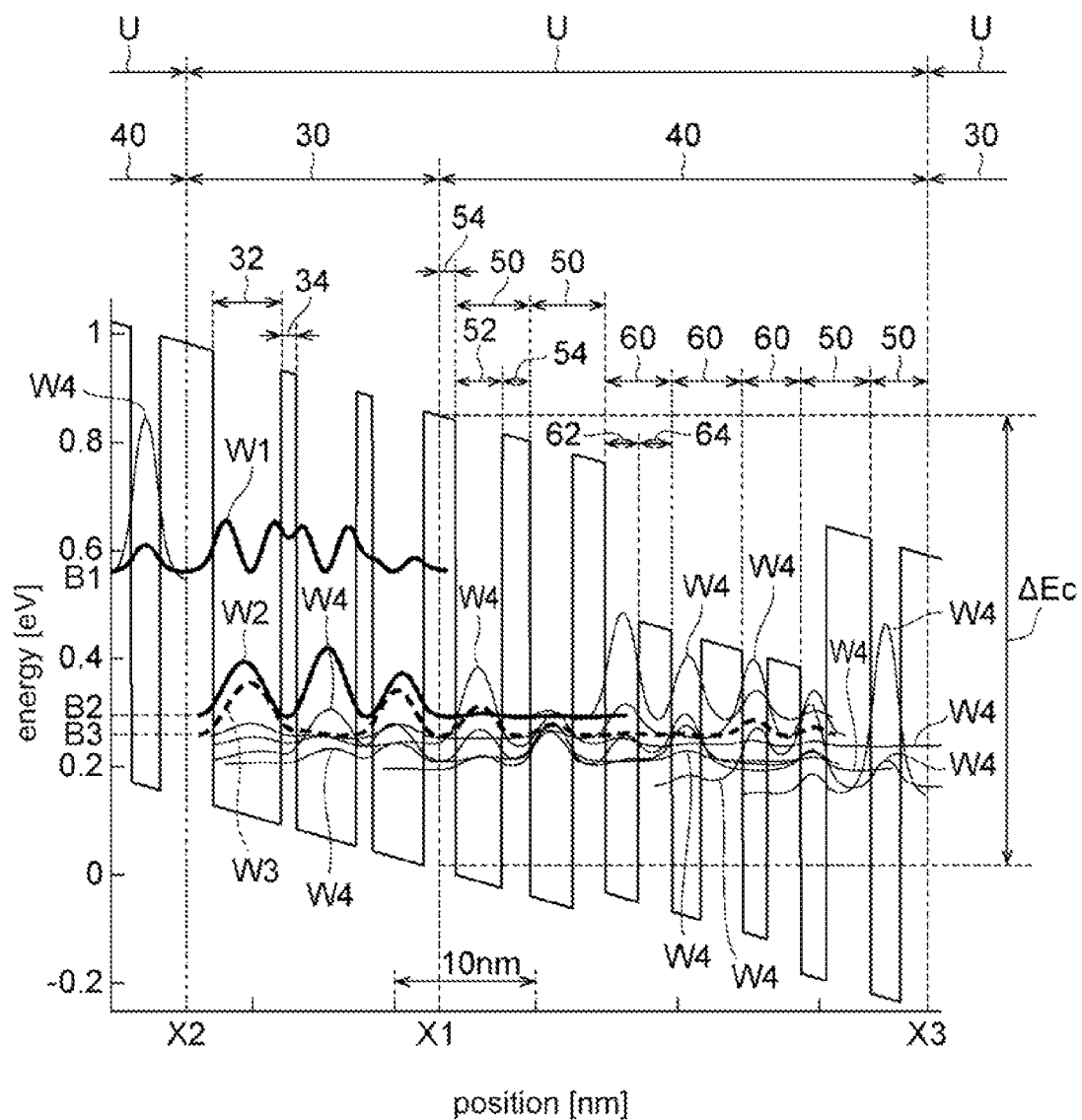
FIG. 3 is a diagram illustrating an example of a conduction band structure of a portion of the core region included in the quantum cascade laser according to the first embodiment.

FIG. 3 is a diagram illustrating an example of a conduction band structure of a portion of the core region included in the quantum cascade laser according to the first embodiment. In FIG. 3, the vertical axis denotes electron energy (eV), and the horizontal axis denotes position (nm) along the axis Ax.

FIG. 3 illustrates curves W1, W2, and W3 each indicating the existence probability of carriers (electrons) (the square of the absolute value of a wave function). The curve W1 indicates a laser upper level of the active layer 30. The curve W2 indicates a laser lower level that is a level at which the carriers injected in the active layer 30 make optical transition (make transition while emitting light) from the laser upper level. The curve W3 indicates a ground level that is a level at which the carriers at the laser lower level relax (make transition at high speed without emitting light).

The base line of the curve W1 is located at energy B1. The base line of the curve W2 is located at energy B2. The base line of the curve W3 is located at energy B3. The energies B1, B2, and B3 are energies of carriers that follow the curves W1, W2, and W3, respectively. Each base line is a straight line that connects the two ends of a corresponding one of the curves W1, W2, and W3 and that is parallel to the horizontal axis. The two ends of each of the curves W1, W2, and W3 are located at positions where the value of the wave function is a sufficiently small value (the existence probability of the carriers is almost zero). The height of each of the curves W1, W2, and W3 relates to the existence probability of the carriers. Positions on the horizontal axis that correspond to the maximal values of the curves W1, W2, and W3 are positions where a large number of carriers may be present.

In the present embodiment, the energy B1 on the base line of the curve W1 is sufficiently lower than the height of an energy barrier of each of the barrier layers 34 of the active layer 30. At a position X1 of the boundary between the active layer 30 and the injection layer 40, the height of the energy barrier of the barrier layer 34 and the height of the energy barrier of the first barrier layer 54 are about 0.85 eV. In contrast, the energy B1 on the base line of the curve W1 is about 0.56 eV. Accordingly, at the position X1, the difference between the energy B1 and each of the heights of the energy barriers of the barrier layer 34 and the first barrier layer 54 is about 0.29 eV. For example, thermal energy that corresponds to a temperature of 200° C. is 0.041 eV, and about 0.29 eV is about 7 times 0.041 eV. Thus, the carriers at the laser upper level in the active layer 30 contribute to the optical transition without leaking to the injection layer 40 even at a high temperature of 200° C. As a result, the luminous efficiency of the quantum cascade laser 10 can be improved.

In the present embodiment, the multilayer structure of each of the unit structures U (the film thickness and the composition of each layer) is designed in such a manner that the energy difference between the curve W2 and the curve W3 is close to the energy of an optical phonon of each of the well layers 32. As a result, the carriers can be more quickly relaxed, and thus, the luminous efficiency of the quantum cascade laser 10 can be improved.

In the present embodiment, the multilayer structure of each of the unit structures U is designed in such a manner that a position on the horizontal axis that corresponds to the maximal value of the curve W1 and a position on the horizontal axis that corresponds to the maximal value of the curve W2 are close to each other. This can increase the probability of optical transition of the carriers. As a result, the luminous efficiency of the quantum cascade laser 10 can be improved.

In the present embodiment, the multilayer structure of each of the unit structures U is designed in such a manner that a position on the horizontal axis that corresponds to the maximal value of the curve W2 and a position on the horizontal axis that corresponds to the maximal value of the curve W3 are close to each other. This can increase the probability of non-radiative transition caused by resonance between the carriers and the phonons. As a result, the carriers can be more quickly relaxed, and thus, the luminous efficiency of the quantum cascade laser 10 can be improved.

FIG. 3 illustrates a plurality of curves W4 that relates to when carriers after light emission move from the ground level (the curve W3) of the active layer 30 to the laser upper level (the curve W1) of the next active layer 30. Each of the curves W4 indicates the existence probability of the carriers (the square of the absolute value of a wave function). At a position X2 of the boundary between the previous injection layer 40 and the active layer 30, the base line of the curve W4 in the previous injection layer 40 is close to the base line (the energy B1) of the curve W1 in the active layer 30. Also at a position X3 of the boundary between the injection layer 40 and the next active layer 30, the base line of each curve W4 in the injection layer 40 is close to the base line of the curve W1 in the next active layer 30.

In the present embodiment, the multilayer structure of each of the injection layer 40 (the film thickness of each layer, the number of layers, and the layer arrangement) is designed in such a manner that the base line of each curve W4 in the injection layer 40 and the base line of the curve W1 in the active layer 30 are close to each other at the position X2 and the position X3. As a result, the carriers can efficiently move from the injection layer 40 to the next active layer 30, and thus, the luminous efficiency of the quantum cascade laser 10 can be improved.

In the present embodiment, the maximal value (peak height) of each curve W4 in the lattice-matched layers 60 is larger than the maximal value (peak height) of each curve W4 in the strain-compensated layers 50 adjacent to the lattice-matched layers 60. The difference between the maximal values indicates that the carriers are likely to accumulate in the lattice-matched layers 60. The ease with which the carrier may accumulate relates to the fact that the height of the energy barrier of the second barrier layer 64 of each of the lattice-matched layers 60 is lower than the height of the energy barrier of the first barrier layer 54 of the adjacent strain-compensated layer 50. The difference between the height of the energy barrier of each of the first barrier layers 54 and the height of the energy barrier of each of the second barrier layers 64 is, for example, 0.1 eV or more and 0.5 eV or less.

In the present embodiment, the energies on the base lines of some of the curves W4 in the lattice-matched layers 60 are each higher than the energy on the base line of each curve W4 in the strain-compensated layers 50. The high energies on the base lines of some of the curves W4 in the lattice-matched layers 60 indicate that carriers having a high energy may be present in the lattice-matched layers 60. In contrast, the energies on the base lines of some of the curves W4 in the lattice-matched layers 60 are each sufficiently lower than the height of the energy barrier of the first barrier layer 54 of each of the strain-compensated layers 50 adjacent to the lattice-matched layers 60. Thus, thermal leakage of the carriers accumulated in the lattice-matched layers 60 beyond the first barrier layers 54 of the adjacent strain-compensated layers 50 is suppressed.

The energies on the base lines of some of the curves W4 in the lattice-matched layers 60 are high due to the fact that the second barrier layers 64 each having a low energy barrier are sandwiched between the plurality of first barrier layers 54 each having a high energy barrier. In the present embodiment, the multilayer structure of the injection layer 40 is designed in such a manner that the energies on the base lines of the curves W4 in the lattice-matched layers 60 do not become too high.

The high energy carriers that may be present in each of the lattice-matched layers 60 are relaxed to a lower energy level band in the lattice-matched layer 60 by phonon scattering. The carriers in the lower energy level band in the lattice-matched layer 60 flow to the next active layer 30 by an electric field and diffusion and can contribute to radiative transition in the next active layer 30.

In the present embodiment, the energy difference $\Delta Ec$ between a conduction band of each of the first well layers 52 and a conduction band of each of the first barrier layers 54 may be 0.6 eV or more. In the case illustrated in FIG. 3, the energy difference ΔEc between the conduction band of each of the first well layers 52 and the conduction band of each of the first barrier layers 54 is 0.84 eV. Each of the first well layers 52 is a $Ga_xIn_{1-x}As$ (x=0.330) layer. Each of the first barrier layers 54 is $Al_xIn_{1-x}As$ (x=0.700) layer. Each of the second well layers 62 is $Ga_xIn_{1-x}As$ (x=0.468) layer. Each of the second barrier layers 64 is $Al_xIn_{1-x}As$ (x=0.476) layer.

According to the quantum cascade laser 10 of the present embodiment, the energy difference ΔEc between the conduction band of each of the first well layers 52 and the conduction band of each of the first barrier layers 54 can be increased by the strain-compensated layers 50. By increasing the energy difference ΔEc, thermal leakage of the carriers at the laser upper level in the active layer 30 can be suppressed. In contrast, the absolute value of the strain of each of the lattice-matched layers 60 with respect to the substrate 12 is small. According to the quantum cascade laser 10 of the present embodiment, accumulation of local strain between the first well layers 52 and the first barrier layers 54 can be suppressed by the lattice-matched layers 60 compared with the case where the lattice-matched layers 60 are not provided. Therefore, the core region 14 having a large energy difference ΔEc and a favorable crystal quality can be obtained.

In the present embodiment, since the plurality of lattice-matched layers 60 are arranged adjacent to one another, accumulation of local strain between the first well layers 52 and the first barrier layers 54 can be reduced compared with the case where the strain-compensated layers 50 are interposed between the plurality of lattice-matched layers 60.

In the present embodiment, since the plurality of lattice-matched layers 60 are interposed between the plurality of strain-compensated layers 50, the strain-compensated layers 50 can be arranged near the active layer 30. For example, the first barrier layer 54 of one of the strain-compensated layers 50 is disposed adjacent to the active layer 30. Thus, the lattice-matched layers 60 are not arranged adjacent to the active layer 30. The energy in the conduction band of the first barrier layer 54 of each of the strain-compensated layers 50 is larger than the energy in the conduction band of the second barrier layer 64 of each of the lattice-matched layers 60. Thus, the probability of leakage of the carriers in the injection layer 40 can be reduced by the first barrier layers 54 of the strain-compensated layers 50.

The quantum cascade laser 10 of the present embodiment may be manufactured in the following manner. First, an n-type InP wafer is prepared. Next, an n-type lower InP clad layer, a core region, an n-type upper InP clad layer, and an n+ type GaInAs contact layer are sequentially grown onto the n-type InP wafer so as to form a semiconductor multilayer body. The core region is formed by alternately and repeatedly growing active layers and injection layers. The active layers and the injection layers are each formed by alternately and repeatedly growing well layers and barrier layers. Each layer is grown by, for example, molecular beam epitaxy or organometallic vapor phase epitaxy. Subsequently, an upper metal electrode is formed on the n+ type GaInAs contact layer, and a lower metal electrode is formed on the rear surface of the InP wafer, so that a substrate product is obtained. After that, the substrate product is divided by cleavage, so that a quantum cascade laser is obtained.

Second Embodiment

Figure 4:
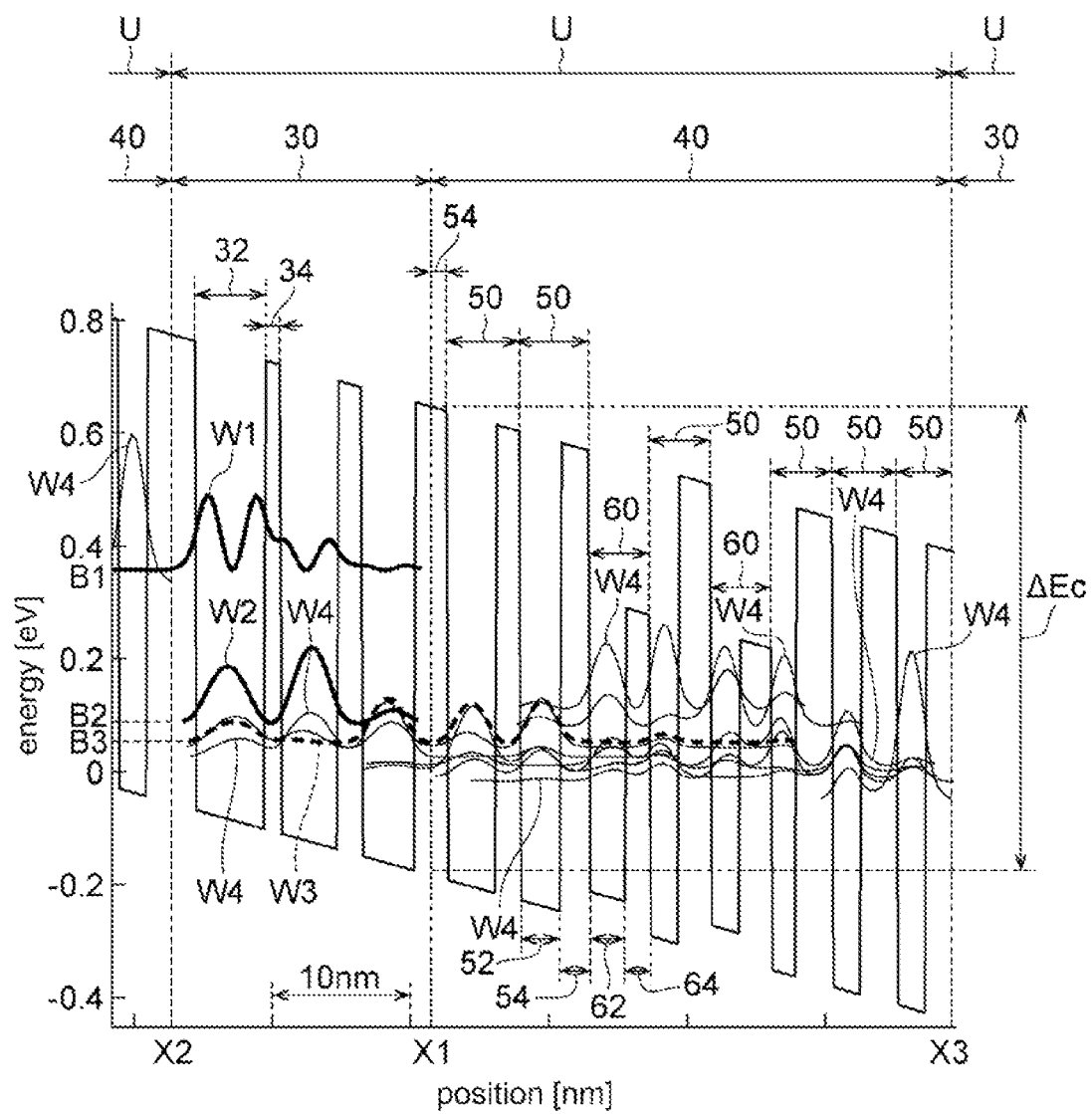
FIG. 4 is a diagram illustrating an example of a conduction band structure of a portion of a core region included in a quantum cascade laser according to a second embodiment.

FIG. 4 is a diagram illustrating an example of a conduction band structure of a portion of a core region included in a quantum cascade laser according to a second embodiment.

The quantum cascade laser of the present embodiment has a configuration the same as the configuration of the quantum cascade laser 10 except with regard to the multilayer structure of the injection layer 40. In the injection layer 40 of the present embodiment, one of the strain-compensated layers 50 is interposed between the plurality of (e.g., two) lattice-matched layers 60.

In the case illustrated in FIG. 4, the energy difference ΔEc between the conduction band of each of the first well layers 52 and the conduction band of each of the first barrier layers 54 is 0.83 eV. Each of the first well layers 52 is a $Ga_xIn_{1-x}As$ (x=0.320) layer. Each of the first barrier layers 54 is $Al_xIn_{1-x}As$ (x=0.700) layer. Each of the second well layers 62 is $Ga_xIn_{1-x}As$ (x=0.468) layer. Each of the second barrier layers 64 is $Al_xIn_{1-x}As$ (x=0.476) layer.

In the present embodiment, at the position X1 of the boundary between the active layer 30 and the injection layer 40, the height of the energy barrier of the barrier layer 34 and the height of the energy barrier of the first barrier layer 54 are about 0.65 eV. In contrast, the energy B1 on the base line of the curve W1 is about 0.36 eV. Accordingly, at the position X1, the difference between the energy B1 and each of the heights of the energy barriers of the barrier layer 34 and the first barrier layer 54 is about 0.29 eV. For example, thermal energy that corresponds to a temperature of 200° C. is 0.041 eV, and about 0.29 eV is about 7 times 0.041 eV. Thus, the carriers at the laser upper level in the active layer 30 contribute to the optical transition without leaking to the injection layer 40 even at a high temperature of 200° C. As a result, the luminous efficiency of the quantum cascade laser 10 can be improved.

In the present embodiment, advantageous effects similar to those of the first embodiment can be obtained. In addition, at least one of the strain-compensated layers 50 may be interposed between the plurality of lattice-matched layers 60, and thus, the degree of freedom when designing the core region 14 is further increased than that in the first embodiment.

Although the preferred embodiments of the present disclosure have been described in detail above, the present disclosure is not limited to the above-described embodiments. The components of the embodiments may be arbitrarily combined.

The quantum cascade laser 10 may have a mesa that includes the core region 14 and the second clad layer 18. The mesa has a height along the axis Ax and extends in a direction crossing the axis Ax. As a result, a current constriction structure can be fabricated. A side surface of the mesa may be covered with, for example, an insulating film containing silicon nitride (SiN) or the like. Alternatively, the mesa may be embedded by, for example, a semi-insulating embedded region containing iron (Fe)-doped InP or the like.

What is claimed is:

1. A quantum cascade laser comprising:
   a substrate that includes a group III-V compound semiconductor; and
   a core region that is provided on the substrate and that includes a group III-V compound semiconductor,
   wherein the core region includes a plurality of unit structures that are stacked on top of one another,
   wherein each of the plurality of unit structures includes an active layer and an injection layer,
   wherein the injection layer includes at least one strain-compensated layer and at least one lattice-matched layer, the at least one strain-compensated layer including a first well layer and a first barrier layer and the at least one lattice-matched layer including a second well layer and a second barrier layer, wherein the first well layer has a lattice constant larger than a lattice constant of the substrate, wherein the first barrier layer has a lattice constant smaller than the lattice constant of the substrate, wherein the second well layer and the second barrier layer each have a lattice constant that is lattice-matched to the substrate, wherein the at least one strain-compensated layer includes a plurality of strain-compensated layers, wherein the at least one lattice-matched layer is disposed between the plurality of strain-compensated layers, wherein an absolute value of a strain of the second well layer with respect to the substrate is 0.3% or less, and wherein an absolute value of a strain of the second barrier layer with respect to the substrate is 0.3% or less.

2. The quantum cascade laser according to claim 1, wherein an absolute value of a strain of the first well layer with respect to the substrate is 0.5% or more.

3. The quantum cascade laser according to claim 1, wherein an absolute value of a strain of the first barrier layer with respect to the substrate is 0.5% or more.

4. The quantum cascade laser according to claim 1, wherein the at least one lattice-matched layer includes a plurality of second well and second barrier layers arranged adjacent to each other.

\* \* \* \* \*